(12) United States Patent
Choi

(10) Patent No.: US 8,536,599 B2
(45) Date of Patent: Sep. 17, 2013

(54) SEMICONDUCTOR LIGHT EMITTING DEVICE AND METHOD OF FABRICATING THEREOF

(75) Inventor: Sung Min Choi, Suwon (KR)

(73) Assignee: LG Innotek Co., Ltd., Seoul (KR)

( * ) Notice: Subject to any disclaimer, the term of this patent is extended or adjusted under 35 U.S.C. 154(b) by 528 days.

(21) Appl. No.: 12/201,883

(22) Filed: Aug. 29, 2008

(65) Prior Publication Data

US 2009/0057703 A1 Mar. 5, 2009

(30) Foreign Application Priority Data

Aug. 31, 2007 (KR) .................. 10-2007-0088285

(51) Int. Cl.
*H01L 33/00* (2010.01)
(52) U.S. Cl.
USPC ....................................... 257/98; 257/E33.07
(58) Field of Classification Search
USPC ............... 257/E33.07, 98, E33.006, E33.008, 257/E33.074
See application file for complete search history.

(56) References Cited

U.S. PATENT DOCUMENTS

| | | | |
|---|---|---|---|
| 6,809,340 B2* | 10/2004 | Kato et al. | 257/79 |
| 7,015,516 B2* | 3/2006 | Eliashevich et al. | 257/98 |
| 7,183,586 B2* | 2/2007 | Ichihara et al. | 257/98 |
| 7,579,205 B2* | 8/2009 | Ikeda et al. | 257/E33.003 |
| 2002/0121863 A1* | 9/2002 | Morishita | 315/169.3 |
| 2004/0041157 A1* | 3/2004 | Watanabe | 257/79 |
| 2006/0017061 A1* | 1/2006 | Sakamoto et al. | 257/103 |
| 2011/0193119 A1* | 8/2011 | Chen et al. | 257/98 |

FOREIGN PATENT DOCUMENTS

JP 09-064467 * 3/1997

* cited by examiner

*Primary Examiner* — Matthew Landau
*Assistant Examiner* — Sun M Kim
(74) *Attorney, Agent, or Firm* — Birch, Stewart, Kolasch & Birch, LLP

(57) ABSTRACT

A semiconductor light emitting device has a first conductive semiconductor layer, an active layer on the first conductive semiconductor layer and a second conductive semiconductor layer on the active layer. An oxide layer is disposed around the first semiconductor layer and is provided between the substrate and active layer. The first semiconductor layer has an uneven pattern along the side edge.

9 Claims, 6 Drawing Sheets

SEMICONDUCTOR LIGHT EMITTING DEVICE AND METHOD OF FABRICATING THEREOF

CROSS-REFERENCE TO RELATED APPLICATIONS

The present application claims priority under 35 U.S.C. 119 to Korean Patent Application No. 10-2007-0088285 (filed on Aug. 31, 2007), which is hereby incorporated by reference in its entirety.

BACKGROUND

The present disclosure relates to a semiconductor light emitting device and a method of fabricating thereof.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

Embodiments provide a semiconductor light emitting device comprising at least one uneven side of an LED chip and a method of fabricating thereof.

Embodiments provide a semiconductor light emitting device capable of improving external quantum efficiency by forming the roughness through a partially uneven portion of a side of an LED chip and a method of fabricating thereof.

Embodiments provide a semiconductor light emitting device capable of improving heat dissipation by increasing the surface area of an LED chip through an uneven side and a method of fabricating thereof.

An embodiment provides a semiconductor light emitting device comprising: a first conductive semiconductor layer comprising an uneven pattern side; an active layer on the first conductive semiconductor layer; and a second conductive semiconductor layer on the active layer.

An embodiment provides a semiconductor light emitting device comprising: a device chip comprising a junction structure of a P-N semiconductor layer, wherein an uneven pattern is formed at a side of at least one semiconductor layer of the device chip.

An embodiment provides a method of fabricating a semiconductor light emitting device comprising: forming a first conductive semiconductor layer comprising an uneven pattern side; forming an active layer on the first conductive semiconductor layer; and forming a second conductive semiconductor layer on the active layer.

The details of one or more embodiments are set forth in the accompanying drawings and the description below. Other features will be apparent from the description and drawings, and from the claims.

DETAILED DESCRIPTION OF THE EMBODIMENTS

Figure 1:
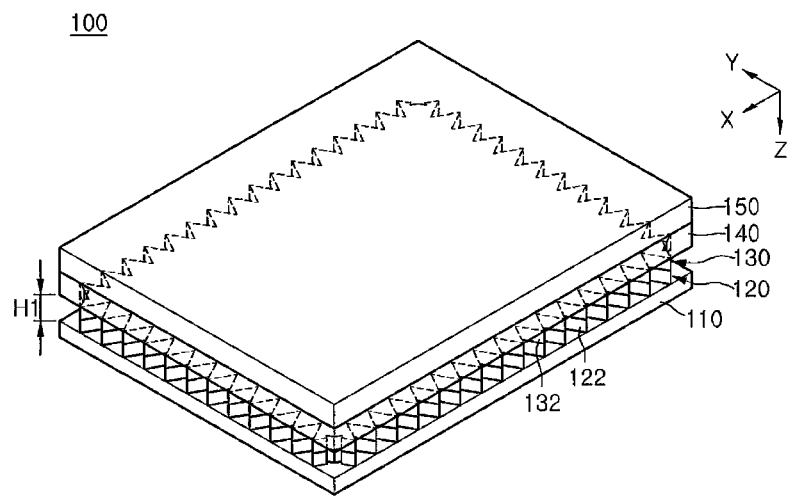
FIG. 1 is a view illustrating a semiconductor light emitting device according to a first embodiment.

Hereinafter, a semiconductor light emitting device and a method of fabricating thereof according to an embodiment will be described with reference to the accompanying drawings. Hereinafter, terms such as 'on' and 'under' with respect to a layer will also be described with reference to the accompanying drawings and the thickness of each layer in the drawings is simply one example and is not limited thereto.

FIG. 1 is a view illustrating a semiconductor light emitting device according to a first embodiment.

Referring to FIG. 1, the semiconductor light emitting device 100 comprises a substrate 110, a buffer layer 120 comprising a side of an uneven pattern 122, a first conductive semiconductor layer 130 comprising a side of an uneven pattern 132, an active layer 140, and a second conductive semiconductor layer 150.

The substrate 110 may comprise $Al_2O_3$, GaN, SiC, ZnO, Si, GaP, or GaAs or may be formed of a conductive substrate. However, the substrate 110 of the present invention is not limited thereto. The top surface of the substrate 110 may be formed with an uneven pattern.

The buffer layer 120 is formed on the substrate 110. The buffer layer 120 may comprise GaN, InN, InGaN, AlInN, AlGaN, or InAlGaN. Additionally, an undoped semiconductor layer (not shown) may be formed on the buffer layer 120. At least one of the buffer layer 120 and/or the undoped semiconductor layer is formed or is not formed at all.

The first conductive semiconductor layer 130 is formed on the buffer layer 120. The first conductive layer 130 may be realized with at least one layer of an n-type semiconductor layer, and the n-type semiconductor may comprise GaN, InN, AlN, AlGaN, InGaN, or InAlGaN and is doped with an n-type dopant. The n-type dopant comprises Si, Ge, Sn, Se, and Te. The first conductive semiconductor 130 may serve as a first electrode contact layer.

The sides of the buffer layer 120 and the first conductive semiconductor layer 130 are formed with the uneven patterns 122 and 132. The uneven patterns 122 and 132 are formed in a direction perpendicular to a direction Z of the growing surfaces of the buffer layer 120 and the first conductive semiconductor layer 130. The uneven patterns 122 and 132 may be formed along side directions X and Y of the buffer layer 120 and the first conductive semiconductor layer 130. The uneven patterns 122 and 132 may be formed in a zigzag structure or a jagged structure of a semi-circular form, a lens form, a curved form, a polygonal form, and a horn form.

Additionally, the uneven patterns 122 and 132 may be formed regularly or irregularly, and the sides of the two layers 120 and 130 may be formed with the same uneven pattern or different uneven patterns.

At least one side of the buffer layer 120 and the first conductive semiconductor layer 130 may be formed with the uneven patterns 122 and 132. The uneven patterns 122 and 132 may be formed at an entire or partial area of each side of the buffer layer 120 and the first conductive semiconductor layer 130.

The thickness H1 of the uneven patterns 122 and 132 may be formed extending from the surface of the substrate 110 up to a predetermined position of the side of the buffer layer 120 or the first conductive semiconductor layer 130. This may vary.

The active layer 140 is formed on the first conductive semiconductor layer 130, and the active layer 140 is formed of a single quantum well structure or a multi quantum well structure. The active layer 140 is formed by at least one cycle comprising a well layer (not shown) and a barrier layer (not shown). The well layer may comprise InGaN, GaN or InAlGaN and the barrier layer may comprise AlGaN, GaN or InAlGaN. A light emitting material of the active layer 140 may vary based on a light emitting wavelength such as a blue wavelength, a red wavelength, and a green wavelength. However, the light emitting material is not limited thereto.

A conductive cladding layer (not shown) may be formed on and/or under the active layer 140 and may be formed of an AlGaN layer.

The second conductive semiconductor layer 150 is formed on the active layer 140. The second conductive semiconductor 150 may be formed of at least one layer of a p-type semiconductor layer. The p-type semiconductor may comprise GaN, InN, AlN, AlGaN, InGaN, or InAlGaN and may be doped with a p-type dopant. The p-type dopant comprises Mg, Zn, Ca, Sr, and Ba.

At least one of a third conductive semiconductor layer (not shown) and a transparent electrode layer (not shown) may be formed on the second conductive semiconductor layer 150. The transparent electrode layer may be formed of at least one of ITO, ZnO, RuOx, TiOx, and IrOx.

The semiconductor light emitting device 100 may be realized with a P-N junction or an N-P junction structure, or an N-P-N junction structure or a P-N-P junction structure, where the third conductive semiconductor layer (not shown) is formed on the second conductive semiconductor layer 150.

The uneven patterns 122 and 132 of the semiconductor light emitting device 100 may be formed at all the sides of the semiconductor layers 120 and 130, but are not limited to a specific semiconductor layer.

The semiconductor light emitting device 100 may enhance light extraction efficiency through the uneven patterns 122 and 132 of the sides of the semiconductor layers 120 and 130 and also improve heat dissipation efficiency through the increased surface area of an LED chip.

FIG. 2(A) is a plan view of a substrate having an LED chip according to a first embodiment and FIG. 2(B) is a partial enlarged view of the LED chip of the substrate.

Figure 2:
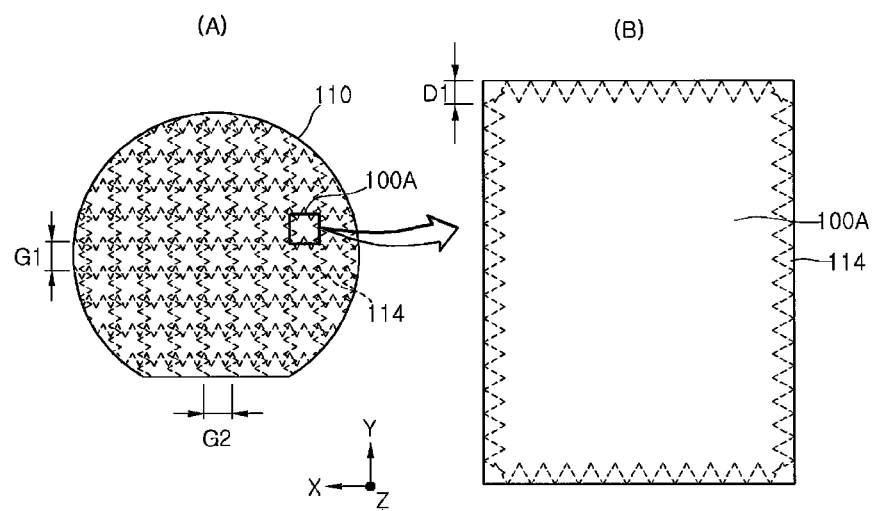
FIG. 2(A) is a plan view of a substrate having an LED chip according to a first embodiment and FIG. 2(B) is a partial enlarged view of the LED chip of the substrate.

Referring to FIG. 2, an uneven pattern thin layer 114 is arranged in a matrix at a boundary region of the LED chip 100A on the substrate 110 (i.e., a wafer).

The side of the uneven pattern thin layer 114 may be formed with a zigzag structure of a semi-circular form, a lens form, a curved form, a polygonal form, and a horn form such that the uneven pattern thin layer 114 can contact the semiconductor thin layer with the uneven structure.

The uneven pattern thin layer 114 is divided into parallel and vertical directions X and Y with the size or interval of the LED chip 100A. Because the uneven pattern thin layer 114 is disposed at a boundary region of the LED chip 100A, each of the LED chip 100A can be separately divided.

Referring to FIG. 2(B), the uneven pattern thin layer 114 or an uneven pattern corresponding to the uneven pattern thin layer 114 may be formed at the side of the separated LED chip 100A. That is, if the uneven pattern thin layer 114 is removed from the LED chip 100A, the side of each LED chip 100A may comprise the uneven patterns of FIG. 1.

The maximum depth D1 of the side of the uneven pattern thin layer 114 at the LED chip 100A may be 1 μm to 50 μm from the sidewall of the LED chip 100A toward the inside. The thickness of the uneven pattern thin layer 114 of the LED chip 100A may be adjusted by the thickness H1 of FIG. 1.

Here, the thickness H1 and uneven form of the uneven pattern thin layer 114 of the LED chip 100A in the vertical direction may differ from those of the uneven pattern thin layer 114 in the parallel direction. That is, the sides of the LED chip 100A may be formed with the uneven patterns of the respectively different forms and thicknesses in the vertical and parallel directions.

FIG. 3(A) is a plan view of a substrate where an LED chip according to a second embodiment grows and FIG. 3(B) is a partial enlarged portion of the LED chip of the substrate.

Figure 3:
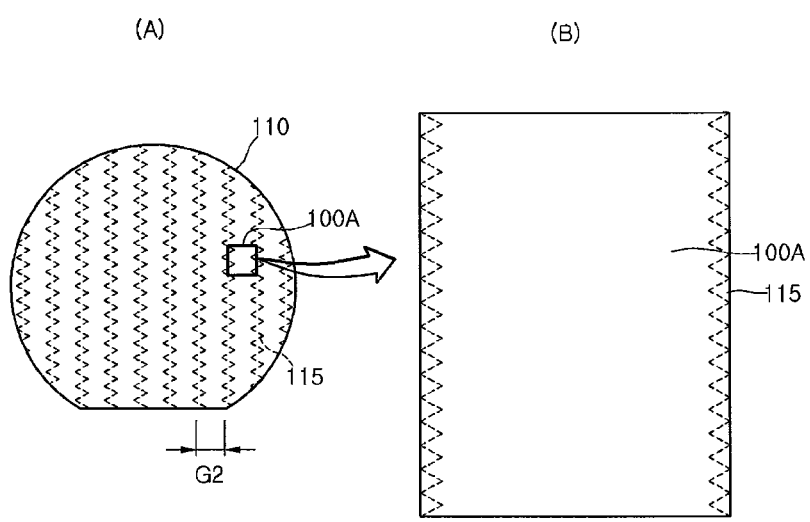
FIG. 3(A) is a plan view of a substrate where an LED chip according to a second embodiment grows and FIG. 3(B) is a partial enlarged portion of the LED chip of the substrate.

Referring to FIG. 3, a first uneven pattern thin layer 115 is arranged in a vertical direction on the substrate 110 and is spaced apart by the interval G2 of the LED chip 100A. The side of the first uneven pattern thin layer 115 may be formed with a zigzag structure of a semi-circular form, a lens form, a curved form, a polygonal form, and a horn form such that the first uneven pattern thin layer 115 can contact the semiconductor thin layer with the uneven structure.

Because the first uneven pattern thin layer 115 is disposed at a boundary region of the LED chip 100A, each of the LED chip 100A can be separately divided.

Referring to FIG. 3(B), the first uneven pattern thin layer 115 or an uneven pattern corresponding to the first uneven pattern thin layer 115 may be formed at the side of the separated LED chip 100A. That is, if the first uneven pattern thin layer 115 is removed from the LED chip 100A, uneven patterns corresponding to the first uneven pattern thin layer 115 may be formed at the right/left side of each LED chip 100A.

FIG. 4(A) is a plan view of a substrate where an LED chip according to a third embodiment grows and FIG. 4(B) is a partial enlarged portion of the LED chip of the substrate.

Figure 4:
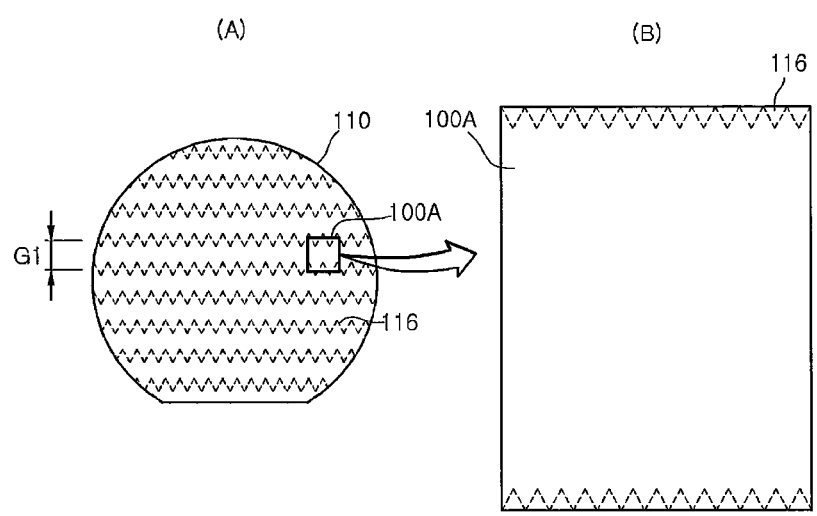
FIG. 4(A) is a plan view of a substrate where an LED chip according to a third embodiment grows and FIG. 4(B) is a partial enlarged portion of the LED chip of the substrate.

Referring to FIG. 4, a second uneven pattern thin layer 116 is arranged in a parallel direction on the substrate 110 and spaced apart by the interval G1 of the LED chip 100A. The side of the second uneven pattern thin layer 116 may be formed with a zigzag structure of a semi-circular form, a lens form, a curved form, a polygonal form, and a horn form such that the second uneven pattern thin layer 116 can contact a semiconductor thin layer with the uneven structure.

Because the first uneven pattern thin layer 116 is disposed at a boundary region of the LED chip 100A, each of the LED chip 100A can be separately divided.

Referring to FIG. 4(B), the second uneven pattern thin layer 116 or an uneven pattern corresponding to the second uneven pattern thin layer 116 may be formed at the side of the separated LED chip 100A. That is, if the second uneven pattern thin layer 116 is removed from the LED chip 100A, uneven patterns corresponding to the second uneven pattern thin layer 116 may be formed at the front/rear side of each LED chip 100A.

Additionally, the first and second uneven pattern thin layers 115 and 116 of FIGS. 3 and 4 may be formed by an interval of two LED chips 100A, and may be formed at only one side of the LED chip 100A. According to the interval, direction, form, and size of the uneven pattern thin layer, the LED chip 100A may have respectively different uneven patterns.

FIGS. 5 to 12 are cross-sectional views illustrating manufacturing processes of a semiconductor light emitting device according to a fourth embodiment.

Figure 5:
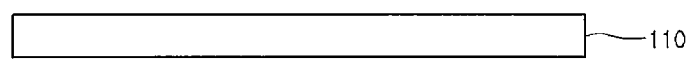
FIGS. 5 to 12 are cross-sectional views illustrating manufacturing processes of a semiconductor light emitting device according to a fourth embodiment.
Figure 6:
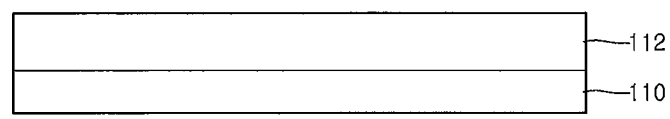

Referring to FIGS. 5 and 6, an oxide thin layer 112 is formed on a substrate 100. The substrate 110 may comprise Al$_2$O$_3$, GaN, SiC, ZnO, Si, GaP, or GaAs or may be formed of a conductive substrate but is not limited thereto. The top surface of the substrate 110 may be formed with an uneven pattern.

Here, the oxide thin layer 112 may be realized with an oxide layer series comprising SiO2, Si3N4, or Si3Nx. The oxide layer may comprise a transmittive oxide layer series.

A nitride semiconductor grows on the substrate 110 and its growth equipment is related to an electron beam depositor, physical vapor deposition (PVD), chemical vapor deposition (CVD), plasma laser deposition (PLD), a dual-type thermal evaporator, sputtering, or metal organic chemical vapor deposition (MOCVD) However, the present invention is not limited thereto.

Figure 7:
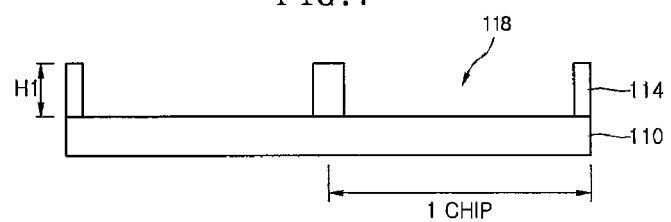

Referring to FIGS. 6 and 7, the oxide thin layer 112 may become an uneven pattern thin layer 114 by using a photoresist pattern, and then the remaining chip regions are removed. At this point, the side of the uneven pattern thin layer 114 may be formed with a zigzag structure of a semi-circular form, a lens form, a curved form, a polygonal form, and a horn form. The side of the uneven pattern thin layer 114 is disposed around a chip formation region 118.

The thickness H1 of the uneven pattern thin layer 114 protrudes from the top surface of the substrate 110 by 1 μm to 7 μm.

Figure 8:
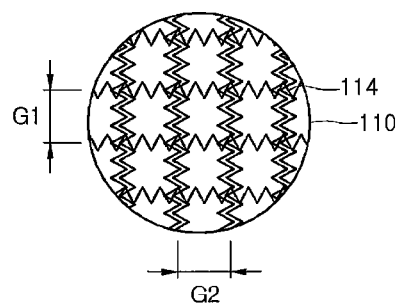

Referring to FIG. 8, the uneven pattern thin layer 114 on the substrate 110 is arranged in a matrix having the predetermined intervals G1 and G2, and its side is formed of a zigzag structure of a semi-circular form, a lens form, a curved form, a polygonal form, and a horn form.

Additionally, the uneven pattern thin layer 114 may be arranged in a parallel or vertical direction but is not limited thereto. The uneven pattern thin layer 114 may be regularly or irregularly formed but is not limited thereto.

Figure 9:
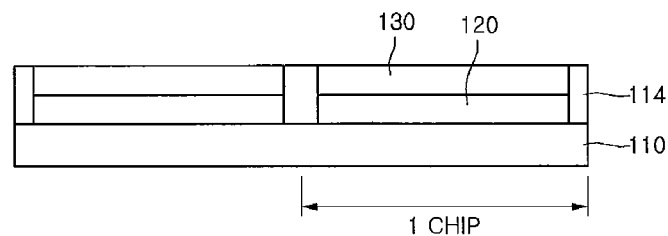

Referring to FIG. 9, a material having a composition equation of Al$_x$In$_y$Ga$_z$N may be deposited on the substrate 110 as a semiconductor thin layer. Here, $0 \leq x \leq 1$, $0 \leq y \leq 1$, $0 \leq z \leq 1$, and $0 < x+y+z \leq 1$.

A buffer layer 120 is formed on the substrate 110, and a first conductive semiconductor layer 130 is formed on the buffer layer 120. The buffer layer 120 and the first conductive semiconductor layer 130 may be formed between the uneven pattern thin layers 114.

The buffer layer 120 may be selected from semiconductor layers comprising GaN, InN, InGaN, AlInN, AlGaN, or InAlGaN. The first conductive semiconductor layer 130 may be realized with at least one of an n-type semiconductor layer, and may comprise GaN, InN, AlN, AlGaN, InGaN, or InAlGaN. The first conductive semiconductor layer 130 may be selectively doped with an n-type dopant such as Si, Ge, Sn, Se, or Te.

Another semiconductor, for example, an undoped semiconductor layer or an n-type semiconductor layer is formed between the buffer layer 120 and the first conductive semiconductor layer 130, and the present invention is not limited thereto.

Referring to FIGS. 8 and 9, because the sides of the buffer layer 120 and the first conductive semiconductor layer 130 contact the side of the uneven pattern thin layer 114, they may be formed with a zigzag structure of a semi-circular form, a lens form, a curved form, a polygonal form, and a horn form. That is, the side of the uneven pattern thin layer 114 contact the growing surface of the buffer layer 120 and the first conductive semiconductor layer 130 in a vertical direction at the chip boundary region.

Referring to FIGS. 7 and 9, the thickness H1 of the uneven pattern thin layer 114 may be formed from the surface of the substrate 110 to the first conductive semiconductor layer 130 or less. Otherwise, the thickness H1 of the uneven pattern thin layer 114 may be formed may be formed from the surface of the substrate 110 to the buffer layer 120 or less.

Figure 10:
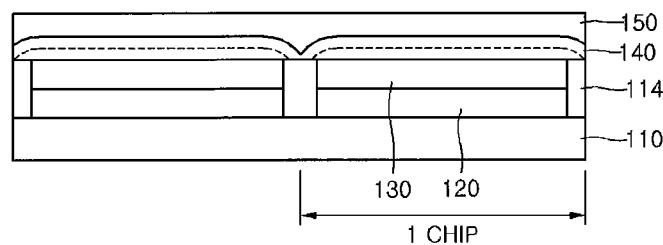

Referring to FIG. 10, the active layer 140 is formed on the first conductive semiconductor layer 130, and the second conductive semiconductor layer 150 is formed on the active layer 140.

The active layer 140 is formed of a single quantum well structure or a multi quantum well structure. The active layer 140 is formed by at least one cycle comprising a well layer (not shown) and a barrier layer (not shown). The well layer may comprise InGaN, GaN or InAlGaN, and the barrier layer may comprise AlGaN, GaN or InAlGaN. A light emitting material of the active layer 140 may vary according to a light emitting wavelength such as a blue wavelength, a red wavelength, a green wavelength. However, the light emitting material is not limited thereto.

The active layer 140 may be formed on the first conductive semiconductor layer 130 and the uneven pattern thin layer 114. The active layer 140 formed on the uneven pattern thin layer 114 may grow different from other regions based on a material of the uneven pattern thin layer 114. However, the present invention is not limited thereto.

A conductive cladding layer (not shown) may be formed on and/or under the active layer 140 and may be formed of an AlGaN layer.

The second conductive semiconductor 150 may be formed of at least one layer of a p-type semiconductor layer. The p-type semiconductor may comprise GaN, InN, AlN, AlGaN, InGaN, or InAlGaN and may be doped with a p-type dopant. The p-type dopant comprises Mg, Zn, Ca, Sr, or Ba.

At least one of a transparent electrode layer (not shown) and an n-type semiconductor layer (not shown) is formed on the second conductive semiconductor layer 150.

Referring to FIGS. 7 and 10, the thickness H1 of the uneven pattern thin layer 114 may be formed to the active layer 140 less than. Otherwise, the thickness H1 of the uneven pattern thin layer 114 may be formed to the second conductive semiconductor layer 150 or less.

Figure 11:
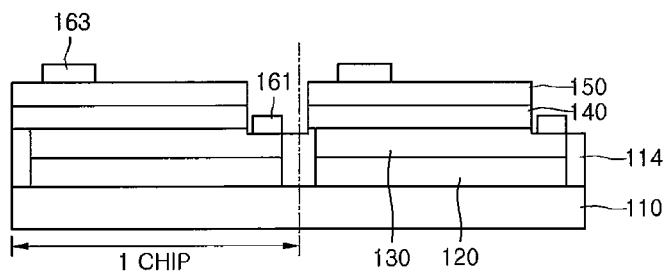
Figure 12:
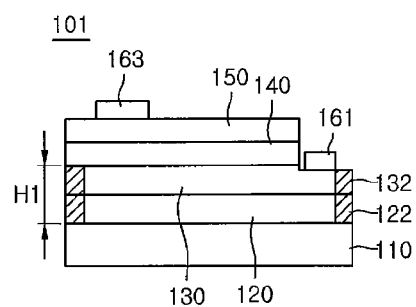

Referring to FIGS. 11 and 12, mesa etching is performed on the chip boundary region. Due to the mesa etching, a portion of the first conductive semiconductor layer 130 is exposed. At this point, the top of the uneven pattern thin layer 114 formed on the outer of the first conductive semiconductor layer 130 may be etched through the mesa etching.

A first electrode layer 161 is formed on the first conductive semiconductor layer 130 and a second electrode layer 163 is formed on the second conductive semiconductor layer 150.

Then, lapping and polishing are performed on the substrate 110, and then through scribing and breaking processes, the substrate 110 are sliced by each chip size. Thereafter, a semiconductor light emitting device 101 of FIG. 12 can be provided through the above processes.

The uneven pattern thin layer 114 having a chip size, which is formed on the side of the semiconductor light emitting device 101, is removed through etching. Or, the uneven pattern thin layer 114 may be formed after the first conductive semiconductor layer 130 is formed. Here, the etching method may use dry and/or wet etching method, but is not limited thereto. Or, the uneven pattern thin layer 114 may not be removed.

When the uneven pattern thin layer 114 is removed from the semiconductor light emitting device 101, the uneven patterns 122 and 132 corresponding to the uneven pattern thin layer 114 are disposed on both sides of the buffer layer 120 and the first conductive semiconductor layer 130.

The semiconductor light emitting device 101 changes a light incident angle by using the uneven patterns 122 and 132 of the buffer layer 120 and the first conductive semiconductor layer 130 such that external quantum efficiency can be improved. Additionally, because a chip surface area is increased by the uneven patterns 122 and 132, heat dissipation efficiency can be improved also.

Figure 13:
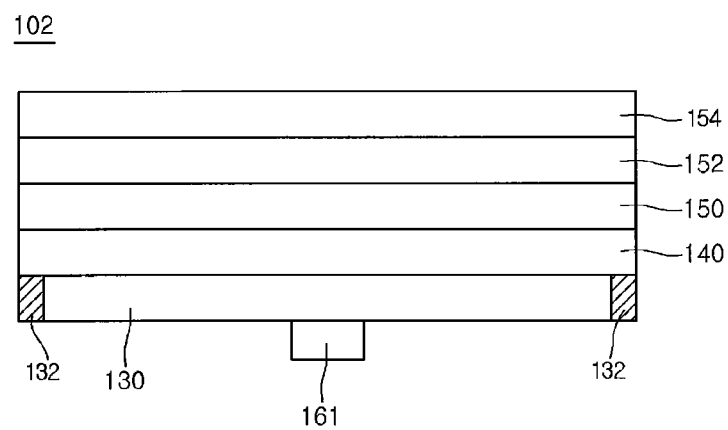
FIG. 13 is a cross-sectional view illustrating a semiconductor light emitting device according to a fifth embodiment.

FIG. 13 is a cross-sectional view illustrating a semiconductor light emitting device according to fifth embodiment. Its overlapping description related to the fourth embodiment will be omitted.

Referring to FIG. 13, a semiconductor light emitting device 102 is a vertical semiconductor light emitting device and comprises a first conductive semiconductor layer 130, an active layer 140, a second conductive semiconductor layer 150, a reflective electrode layer 152, and a conductive support substrate 154.

The reflective electrode layer 152 is formed on the second conductive semiconductor layer 150, and the conductive support substrate 154 is formed on the electrode layer 152. The reflective electrode layer 152 may be formed of one of Al, Ag, Pd, Rh, and Pt, and the conductive support substrate 154 may be formed of Cu or Au. The present invention is not limited thereto.

Here, as illustrated in FIG. 9, the substrate 110 and the buffer layer 120 are disposed under the first conductive semiconductor layer 130. The substrate 110 and the buffer layer 120 are removed through physical or/and chemical removal method. Here, the physical removal method separates the substrate 110 by projecting a laser of a predetermined wavelength on the substrate 110, and then, removes the buffer layer 120 through a wet or dry etching method. Additionally, the chemical removal method separates the substrate 110 by injecting an etchant on the buffer layer 120, and then removes the buffer layer 120 through a chemical etching method.

The first electrode layer 161 may be formed under the first conductive semiconductor layer 130. Accordingly, the vertical semiconductor light emitting device 102 of FIG. 13 is fabricated.

In the vertical semiconductor light emitting device 102, the side of the first conductive semiconductor layer 130 is formed with the uneven pattern 132. Therefore, external quantum and heat dissipation efficiencies can be improved.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a substrate;
a first semiconductor layer on the substrate, wherein a side surface of a lateral periphery of the first semiconductor layer comprises a recessed portion;
an active layer on the first semiconductor layer;
a second conductive semiconductor layer on the active layer, wherein a portion of the recessed portion is recessed with respect to a side surface of a lateral periphery of the substrate and a side surface of a lateral periphery of the second conductive semiconductor layer; and
an oxide layer disposed on a side surface of the recessed portion around the first semiconductor layer,
wherein the oxide layer is provided between the substrate and the active layer,
wherein a portion of a top surface of the oxide layer is in contact with a bottom surface of the active layer,
wherein the oxide layer is on a top surface of the substrate, and
wherein the first semiconductor layer comprises a buffer layer and a first conductive semiconductor layer.

2. The semiconductor light emitting device of claim 1, wherein a surface of the oxide layer comprises an uneven pattern, which is in contact with a side surface of the first semiconductor layer.

3. The semiconductor light emitting device of claim 1, wherein the first semiconductor layer comprises an n-type semiconductor layer.

4. The semiconductor light emitting device of claim 2, wherein the uneven pattern comprises at least one of a semicircular form, a lens form, a curved form, a polygonal form, and a horn form.

5. The semiconductor light emitting device of claim 1, wherein the oxide layer has an approximate thickness of 1 μm to 7 μm from a top surface of the substrate.

6. The semiconductor light emitting device of claim 2, wherein an uneven pattern depth between a concave surface of the uneven pattern and a convex surface of the uneven pattern is in an approximate range between 1 μm and 50 μm.

7. The semiconductor light emitting device of claim 1, wherein at least one of an electrode layer, a transparent electrode layer, an n-type semiconductor layer, and a reflective electrode layer is disposed on the second conductive semiconductor layer.

8. The semiconductor light emitting device of claim 2, wherein the uneven pattern has a thickness approximately equal to the first semiconductor layer.

9. The semiconductor light emitting device of claim 2, wherein the uneven pattern comprises a periodical pattern or a random pattern.

* * * * *